United States Patent
Matsushige et al.

(10) Patent No.: US 7,622,974 B2
(45) Date of Patent: Nov. 24, 2009

(54) SEMICONDUCTOR DEVICE

(75) Inventors: Muneaki Matsushige, Kanagawa (JP); Hiroyuki Satake, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 65 days.

(21) Appl. No.: 11/583,728

(22) Filed: Oct. 20, 2006

(65) Prior Publication Data

US 2007/0208982 A1 Sep. 6, 2007

(30) Foreign Application Priority Data

Nov. 4, 2005 (JP) ............................. 2005-321059

(51) Int. Cl.
*H03K 3/02* (2006.01)
(52) U.S. Cl. .................. 327/198; 327/142; 327/155; 377/73; 377/81
(58) Field of Classification Search ................. 327/142, 327/143, 198, 34, 155; 377/64, 73, 75, 76, 377/81, 60, 70, 72; 714/731
See application file for complete search history.

(56) References Cited

U.S. PATENT DOCUMENTS

| 6,057,719 | A  | * | 5/2000 | Austin et al. ................ 327/117 |
| 6,407,597 | B1 | * | 6/2002 | Ishiwaki ..................... 327/142 |
| 7,034,591 | B2 | * | 4/2006 | Wang ......................... 327/158 |
| 7,388,415 | B2 | * | 6/2008 | Lee ............................ 327/158 |

FOREIGN PATENT DOCUMENTS

JP 2004-294224 10/2004

* cited by examiner

*Primary Examiner*—Long Nguyen
(74) *Attorney, Agent, or Firm*—Young & Thompson

(57) ABSTRACT

A semiconductor integrated circuit apparatus includes a periodic signal generation circuit connected with N logical circuits, wherein the N is a natural number, outputting a periodic signal. The periodic signal generation circuit includes a reset circuit outputting a reset signal initializing according to outputs from a first stage logic circuit to N−1th logic circuit.

9 Claims, 8 Drawing Sheets

SEMICONDUCTOR DEVICE

BACKGROUND OF THE INVENTION

1. Field of the Invention

The present invention relates to a semiconductor integrated circuit apparatus, and particularly to a semiconductor integrated circuit apparatus automatically restoring data stored to a plurality of logic circuits connected in series in an event of data loss due to noise or soft error.

2. Description of Related Art

In recent years, a manufacturing process of a semiconductor integrated circuit apparatus becomes more and more miniaturized. A semiconductor integrated circuit apparatus formed in such a miniaturized manufacturing process consumes low operating power supply voltage having small parasitic capacity in devices. Accordingly in such semiconductor integrated circuit, data stored in a logic circuit mounted therein may be lost due to noise or soft error.

The noise here indicates a noise generated due to an interference of adjacent lines in a semiconductor integrated circuit apparatus, an external noise supplied externally, or a noise generated at a junction of a synchronous circuit and an asynchronous circuit. These noises cause an amplitude of a signal waveform to be smaller, or rising edge of a signal may be delayed for example.

The soft error here indicates an error that in case radiation (for example neutron radiation and a radiation) is inserted to a semiconductor integrated circuit apparatus, a semiconductor substrate reacts with the radiation, generating a charge, and a logic is inverted by a plurality of the generated charges in output devices of a logic circuit being collected.

Such noise or soft error could disable a circuit to recognize a synchronizing clock that activates the circuit because the noise and soft error reduce an amplitude of a signal. Further, even with a reduction in the amplitude small enough for the circuit to still recognize the signal, the signal could delay while the signal transmits through lines due to parasitic resistance or capacity in the lines or devices. In this case also, the circuit is disabled to recognize the signal. In case an amplitude of a signal waveform is reduced due to the noise and soft error, a circuit may induce a malfunction, thereby losing data stored in a logic circuit, for example.

A loss of data is described hereinafter in detail. A circuit having a plurality of logic circuits connected in series is explained as an example. A circuit of shift register as an example of such circuit is shown in FIG. 6. A shift register 2 shown in FIG. 6 includes registers REG0 to REG7 connected in series. An output from the REG7 is connected to an input of the register REG0. A clock CLK is input to each of the registers REG0 to REG7. The shift register synchronizes with the clock CLK to operate. Outputs from the REG3 to REG5 are connected to blocks not shown, with control signals A to C to the blocks. The control signals A to C are signals used to control the blocks.

A timing chart of the shift register 2 of FIG. 6 is shown in FIG. 7. As shown in FIG. 7, at time t0 where power is turned on for the shift register, data 1 is set to the register REG0 by a power-on reset operation. At this time, data 0 is set to other registers. After the time t0, data 1 transits to a register connected subsequently in response to a rising edge of the clock CLK. At time t7, data 1 is stored to the register REG7 by this operation. Then data 1 is returned to the register REG0 at a rising edge of the clock at time t8. That is, the shift register 2 shown in FIG. 6 is a circuit that data 1 transits in a loop of the registers REG0 to REG7 in response to rising edges of clocks.

A timing chart in case data is lost in the shift register 2 operating as above is shown in FIG. 8. As shown in FIG. 8, in case an amplitude of a clock to be input at time t3 is reduced due to noise or soft error, the REG3 is not activated even with the REG2 being activated. Further, data 1 stored to the REG2 does not transit to the REG3 and is lost. The lost data is not restored until turning on the power again.

A specific example of the shift register is disclosed in Japanese Unexamined Patent Application Publication No. 2004-294224. The shift register disclosed in Japanese Unexamined Patent Application Publication No. 2004-294224 includes 5 registers connected in series, having an exclusive or of outputs from first, third, and fifth stages as an input of the first stage. This shift register generates patterns of random numbers. In case data 1 stored to a register is lost due to noise or soft error, this circuit also generates a pattern different from a correct pattern of random numbers. Further, all data stored to a register may become data 0 depending on a status of the pattern of random numbers. In such case, data 1 cannot be transited after that as with the shift register shown in FIG. 6.

SUMMARY OF THE INVENTION

According to an aspect of the present invention, there is provided a semiconductor integrated circuit apparatus that includes a periodic signal generation circuit connected with N logical circuits, wherein the N is a natural number, outputting a periodic signal, and a reset circuit outputting a reset signal initializing according to outputs from a first stage logic circuit to N−1th logic circuit among the N logic circuits.

According to the semiconductor integrated circuit apparatus of the present invention, the reset circuit generates a reset signal initializing the first stage logic circuit according to the output signals from the first stage logic circuit to the N−1th logic circuit. For example in case outputs from the first logic circuit to the N−1th logic circuit become the same logic, the reset circuit generates a reset signal to input the reset signal to the first stage logic circuit. Accordingly in case an amplitude of a synchronizing clock is reduced and data transition is failed to lose the data, the periodic signal generation circuit can be initialized by detecting the data loss and inputting data 1 to the first stage logic circuit. The semiconductor integrated circuit apparatus of the present invention therefore is capable of transiting data 1 without restarting such as turning the power on again.

Further, in case the reset circuit generates a reset signal according to all the output signals from the N logic circuits, all the logic circuits have data 0 for a period of one clock after output signals from all the logic circuit. However by the reset circuit generating the reset signal according to output signals from the first stage logic circuit to N−1th stage, data 1 can be input to the first stage logic circuit while Nth stage logic circuit is outputting data 1. This enables to use all synchronizing clocks for transitions of data 1.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

An embodiment of the present invention is described hereinafter in detail. A semiconductor integrated circuit apparatus of a first embodiment is a periodic signal generation circuit whereby a plurality of logic circuits is connected in series outputting a periodic signal. In this embodiment, a shift register comprised of an N registers connected in series is described hereinafter in detail as an example. A shift register 1 of this embodiment is shown in FIG. 1.

Figure 1:
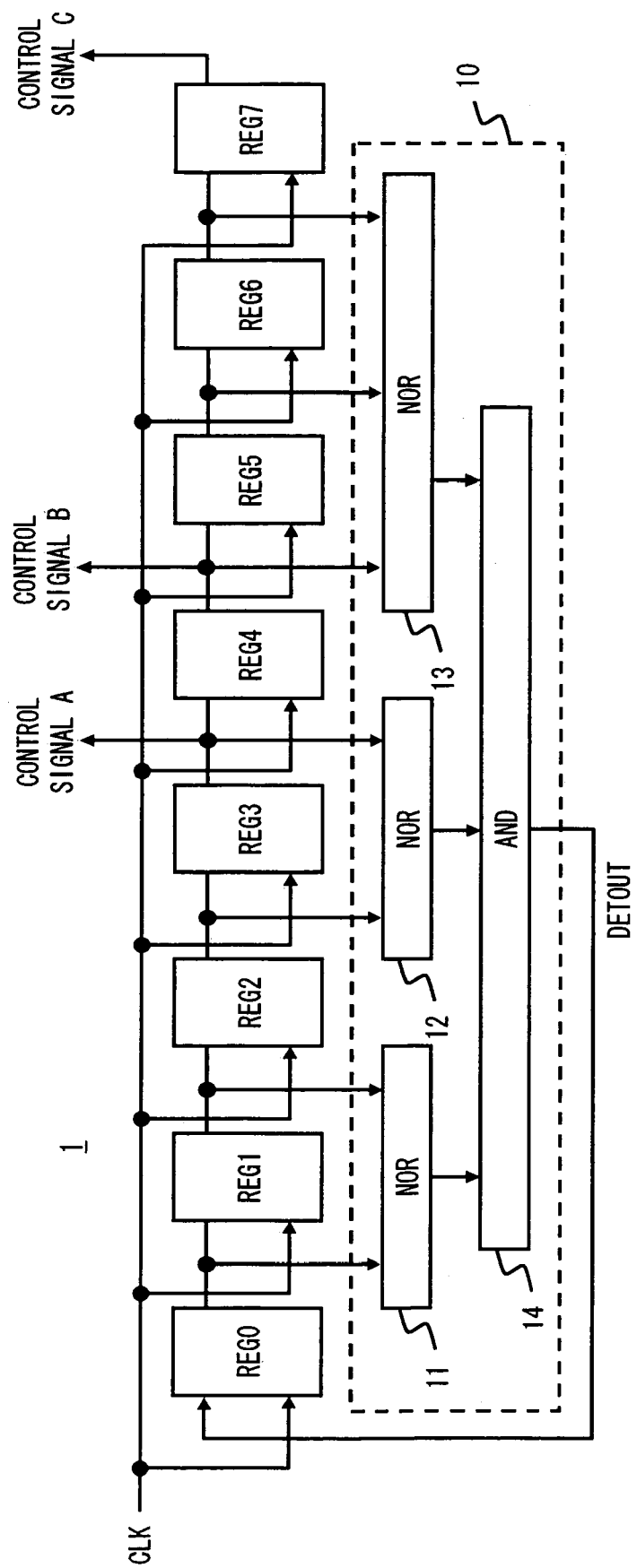
FIG. 1 is a circuit view showing a shift register according to a first embodiment of the present invention.

As shown in FIG. 1, the shift register 1 of this embodiment assumes N=8, having registers REG0 to REG7, and a reset circuit 10. A first stage of the shift register 1 is REG0. The registers REG1 to REG7 are connected in series to the register REG0. A synchronizing clock CLK is input to the registers REG0 to REG7. Outputs signals of the registers REG3, REG4, and REG7 are control signals A to C respectively that are used in other circuit blocks.

An input of the reset circuit 10 is connected with outputs from the registers REG0 to REG6, and an output (DETOUT) of the reset circuit 10 is connected to an input of the register REG0. An output from the register REG7 is not input to the reset circuit 10. A connection of the reset circuit 10 is described hereinafter in detail.

The reset circuit 10 includes NOR gates 11 to 13, and an AND gate 14. Outputs from the register REG0 and REG1 are connected to an input of the NOR gate 11. Outputs from the register REG2 and REG3 are connected to an input of the NOR gate 12. Outputs from the registers REG4 to REG6 are connected to an input of the NOR gate 13. The outputs from the NOR gates 11 to 13 are connected to an input of the AND gate 14. An output from the AND gate 14 is connected to the input of the register REG0.

The registers REG0 to REG7 of this embodiment obtains input signals in response to a rising edge of the synchronizing clock CLK to output. The NOR gates 11 to 13 each include a plurality of input terminals. In case all signals input to each of the terminal is low level (for example a ground potential, data 0), high level (for example a power supply potential, data 1) is output. In case at least one signal input to each of the terminal is high level, low level is output. The AND gate 14 includes a plurality of input terminals. In case all signals input to each of the terminal is high level, high level is output. In case at least one signal input to each of the terminal is low level, low level is output.

Figure 2:
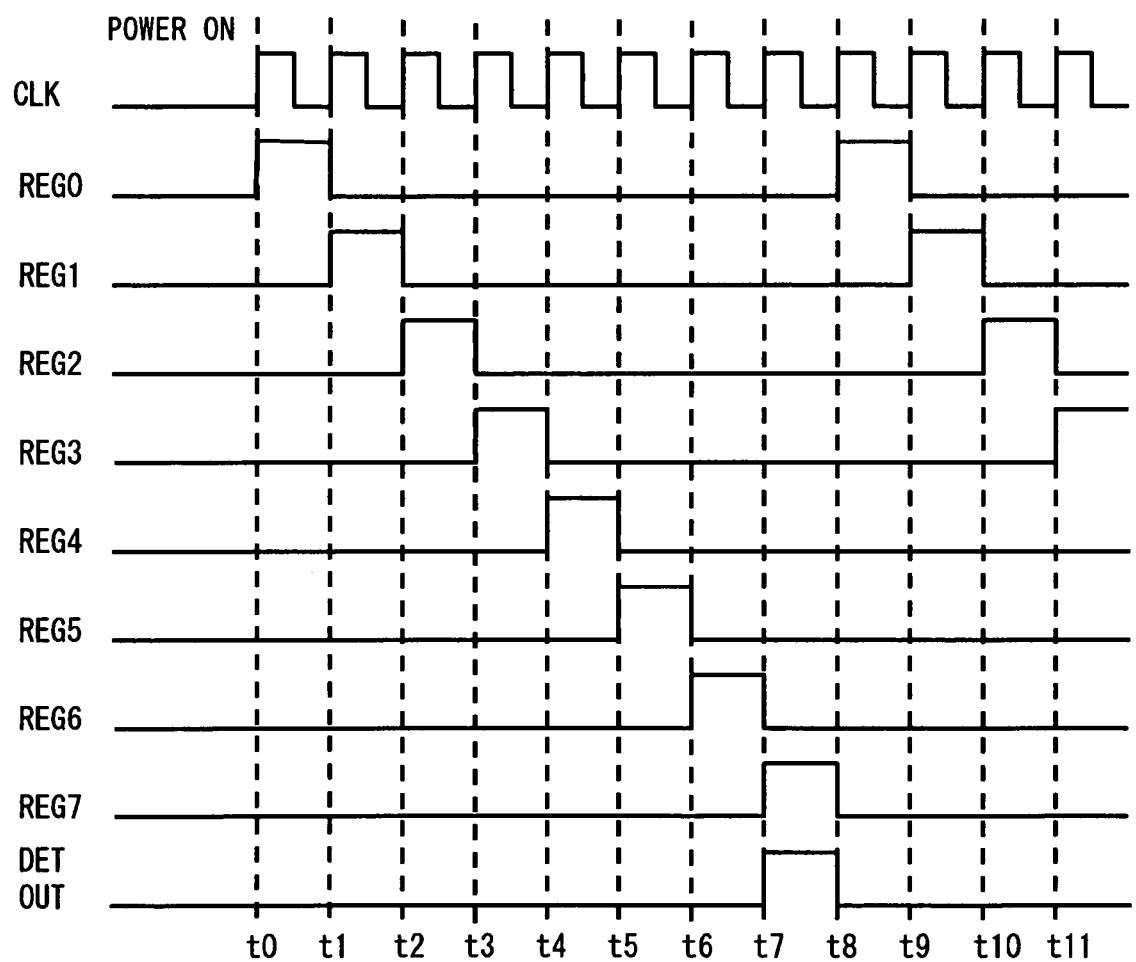
FIG. 2 is a timing chart showing a shift register according to a first embodiment of the present invention.

An operation of the shift register 1 of the first embodiment is described hereinafter in detail. FIG. 2 shows a timing chart of the shift register 1 of the first embodiment. As shown in FIG. 2, in the shift register 1, data 1 is set to the register REG0 at timing t0 on a power on. Then from timings t1 to t2, data 1 is sequentially transmitted at an every rising edge of the synchronizing clock CLK from the register REG1 to REG6 that are connected as subsequent stages. At timing t7, data 1 is set to the register REG7. Then the outputs of the registers REG0 to REG6 become data 0. At this time the reset circuit 10 outputs data 1, and data 1 is set to the input of the register REG0. The register REG0 obtains data 1 that is set at the timing t7, at a rising edge of the synchronizing clock, which is timing t8. The operation from timings t1 to t8 is repeated afterward.

Accordingly the shift register 1 of the first embodiment is a circuit sequentially transiting data 1 through registers connected in series in response to rising edges of a clock that is specified at a power on.

An operation of the reset circuit 10 is described hereinafter in detail. After the power is turned on at the timing t0, the register REG0 outputs data 1, and the registers REG1 to REG7 output data 0. At this time the NOR gate 11 is input with data 0 and data 1. Thus the NOR gate 11 outputs data 0. Further, data 0 is input to the inputs of the NOR gates 12 and 13. Thus the NOR gates 12 and 13 each outputs data 1. Accordingly the outputs from the NOR gates 11 to 13 at the timing t0 are respectively data 0, data 1, and data 1. Thus at the timing t1, the output from the AND gate 14 that inputs those signals is data 0. After that from the timing t1 to t6, the AND gate 14 outputs data 0 as long as one of the registers REG0 to REG6 outputs data 1.

At the timing t7 when the registers REG0 to REG6 outputs data 0, the NOR gates 11 to 13 each outputs data 1. This makes all signals input to the AND gate 14 to be data 1, thus the AND gate 14 outputs a reset signal (for example data 1). After that as long as one of the registers REG0 to REG6 outputs data 1, the AND gate 14 outputs data 0. Accordingly the reset signal is a pulse signal that becomes an inversed logic (for example data 1) to output signals while the output signals from the first stage logic circuit to N–1th logic circuit are the same logic (for example data 0)

A case of losing data 1 in the shift register 1 is explained hereinafter in detail. As an example of data loss, a case where an amplitude of a synchronizing clock is reduced to disable the register REG3 to respond with the synchronizing clock, thereby losing data 1 is explained hereinafter. A timing chart of the shift register 1 in such case is shown in FIG. 3.

Figure 3:
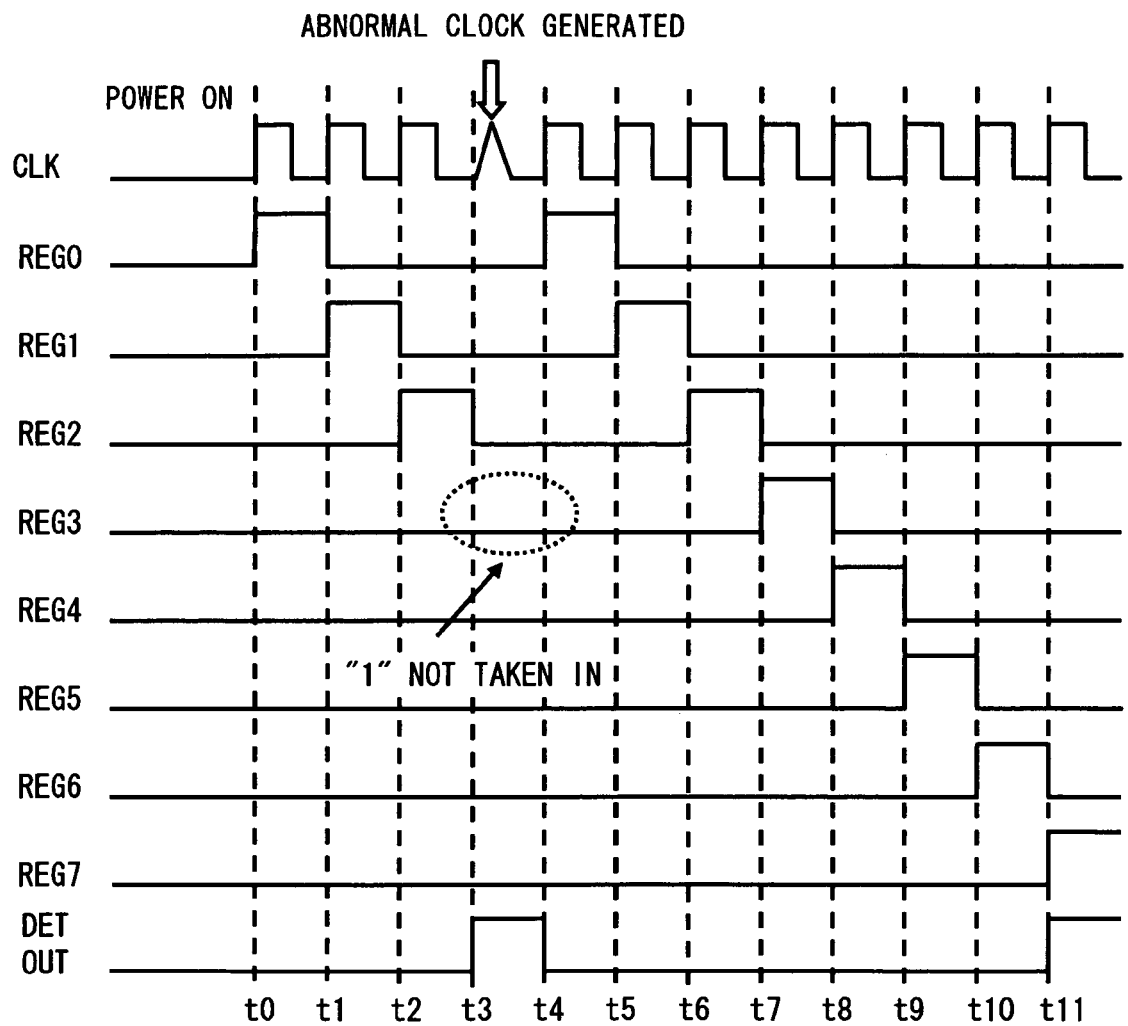
FIG. 3 is a timing chart in case data 1 is lost in the shift register of the first embodiment.

As shown in FIG. 3, the power is turned on at timing to and data 1 is set to the register REG0. Data 1 transits to the register REG2 in an operation from timings t0 to t2. At timing t3, an amplitude of a synchronizing clock is reduced due to noise or soft error. Thus even the register REG2 is operating in response to the synchronizing clock, the register REG3 is not able to respond and operate. In such case, the register REG2 takes data 0, which is being input at that time, in response to a rising edge of the synchronizing clock at timing t3. On the other hand the register REG3 is not able to take in data 1, that is output from the register REG2 at a rising edge of the synchronizing clock which is the timing t3. Thus the register REG3 keep storing data 0 that is stored at the timing t2. Data 1 that is supposed to transit to the register REG3 is lost.

In case data 1 is lost in this way, outputs from the registers REG0 to REG6 of the shift register 1 all become data 0. The reset circuit 10 generates a reset signal (for example data 1) in case all the outputs from the registers REG1 to REG6 become data 0 and sets data 1 to the input of the register REG0.

Accordingly, in the reset circuit 10, in case all the outputs from the registers REG0 to REG6 become data 0, the AND gate 14 outputs data 1 because the NOR gates 11 to 13 output data 1. By this operation, the reset circuit 10 generates the reset signal (for example data 1) in case data 1 is lost in any of the register REG0 to REG6 due to noise or soft error. On the other hand in case any one of the registers REG0 to REG6 outputs data 1, in the reset circuit 10, the AND gate 14 outputs data 0 because an NOR gate connected with the register outputting data 1 outputs data 0.

Then at the timing t4, the register REG0 takes data 1 in response to a rising edge of the synchronizing clock. After that, the shift register 1 repeats the operation from the timings t1 to t8, which is shown in FIG. 2.

As described in the foregoing, in the shift register 1 of the first embodiment, in case data 1 is not stored to any register due to noise or soft error while the registers are performing an operation to transit one data 1, the reset circuit 10 generates a reset signal (for example data 1) in response to all the outputs from N−1 registers (in this embodiment, registers REG0 to REG6) becoming data 0. Then the shift register 1 sets the reset signal to an input of the register REG0, which is the first stage. This enables the register REG0 to take in data 1 in response to a rising edge of the synchronizing clock that is input after data 1 is lost. By data 1 transiting through the registers, the shift register 1 is able to initialize without performing a reset operation such as restarting the power. Further, after the initialization, data 1 can be transited. Accordingly, in case the outputs from the first stage logic circuit to N−1th stage logic circuit matches with a signal of a first level (for example data 0), the reset circuit 10 outputs a second level (for example data 1) regardless of the output from Nth stage logic circuit. Even in case data 1 is not stored to any register due to noise or soft error, it is possible to initialize without a reset operation such as restarting the power.

Figure 4:
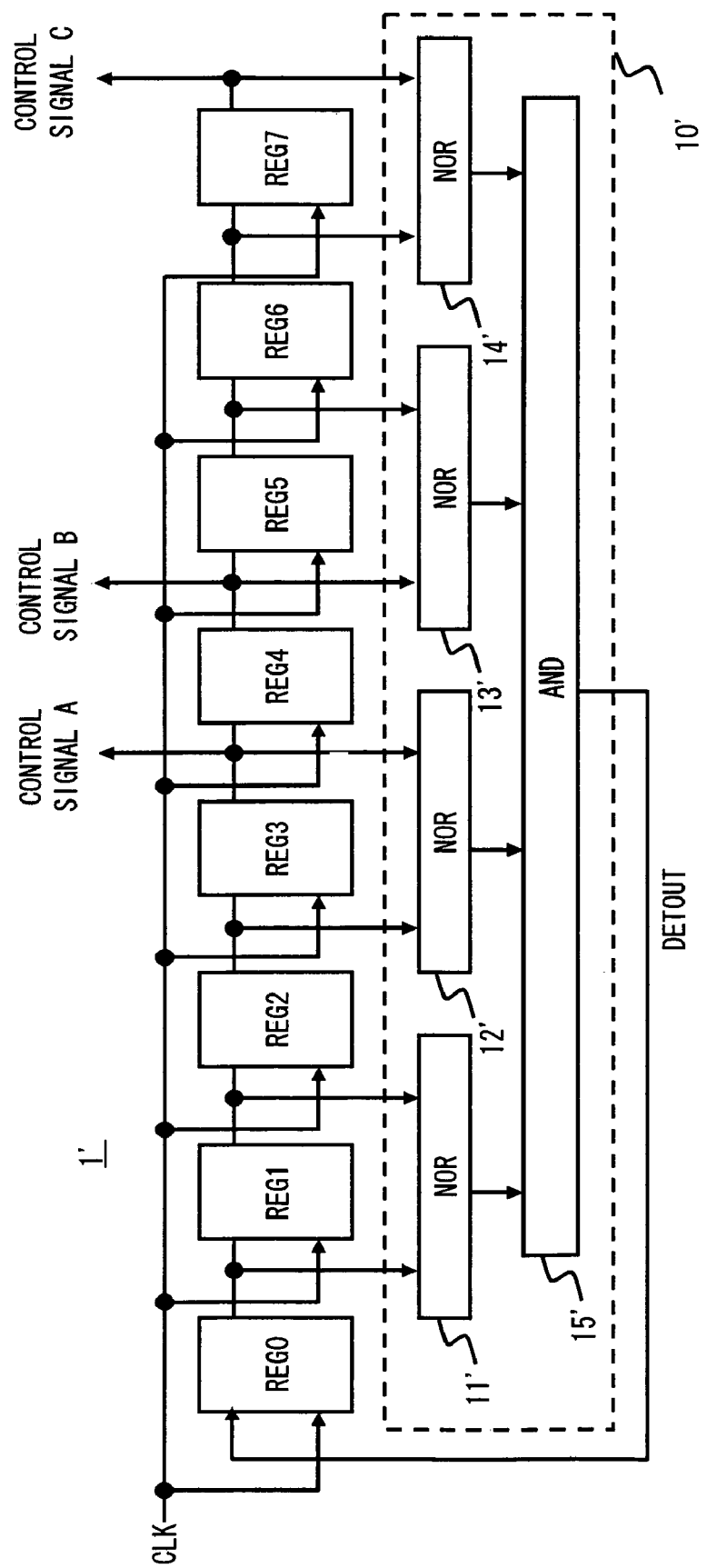
FIG. 4 is a circuit diagram showing the shift register of the first embodiment in case outputs from all registers are input to a reset circuit.
Figure 5:
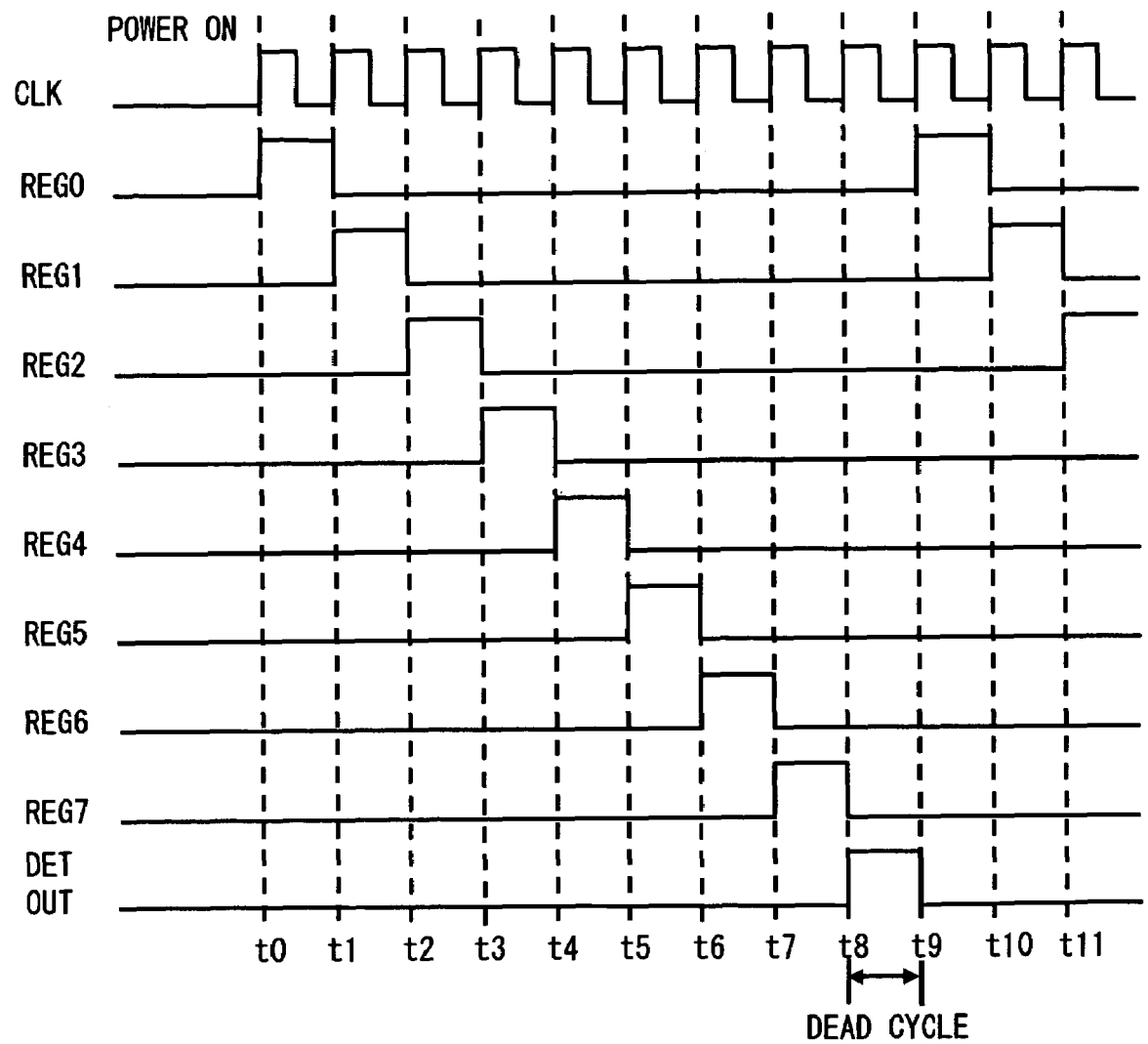
FIG. 5 is a timing chart showing a shift register of FIG. 4.
Figure 6:
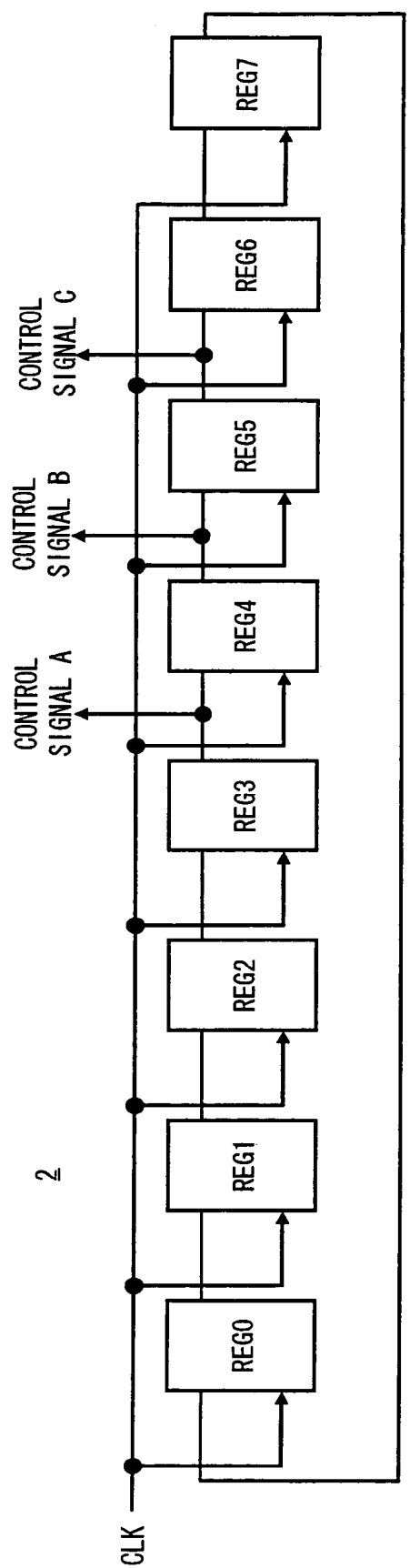
FIG. 6 is a circuit view showing a shift register according to a conventional technique.
Figure 7:
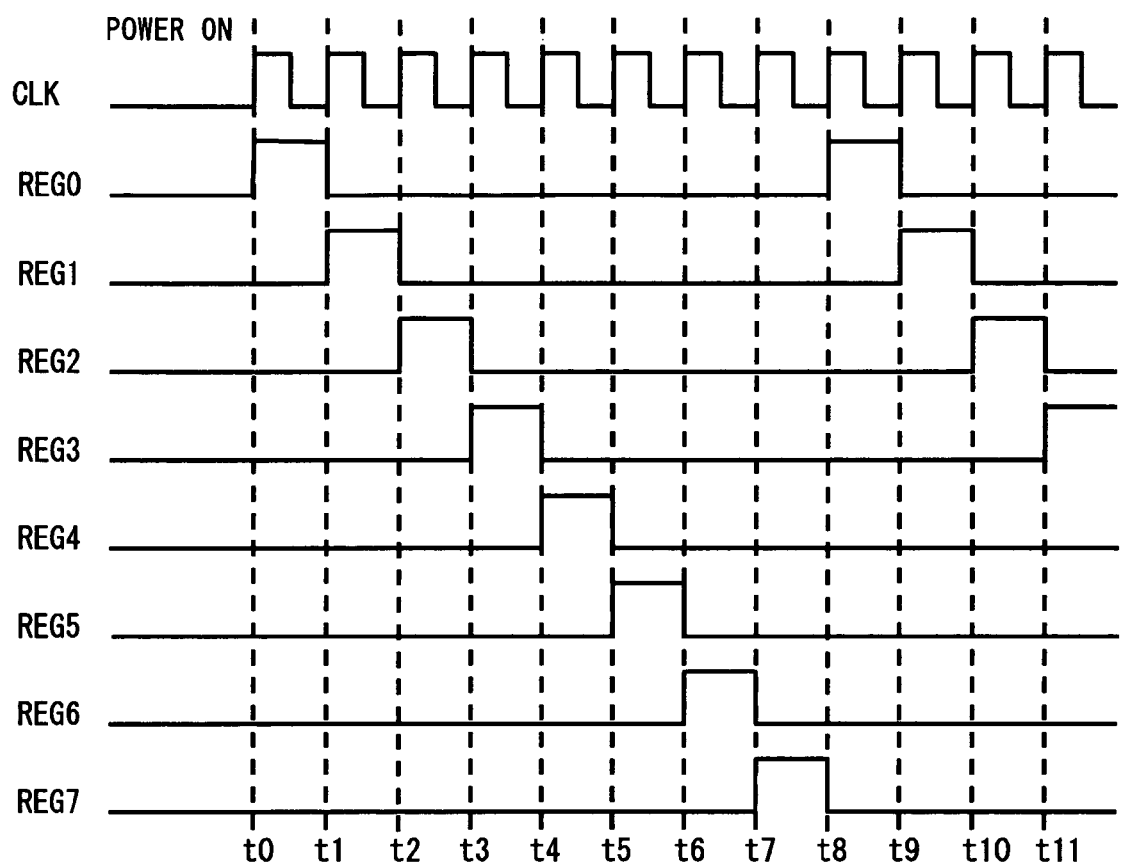
FIG. 7 is a timing chart showing a shift register according to a conventional technique.
Figure 8:
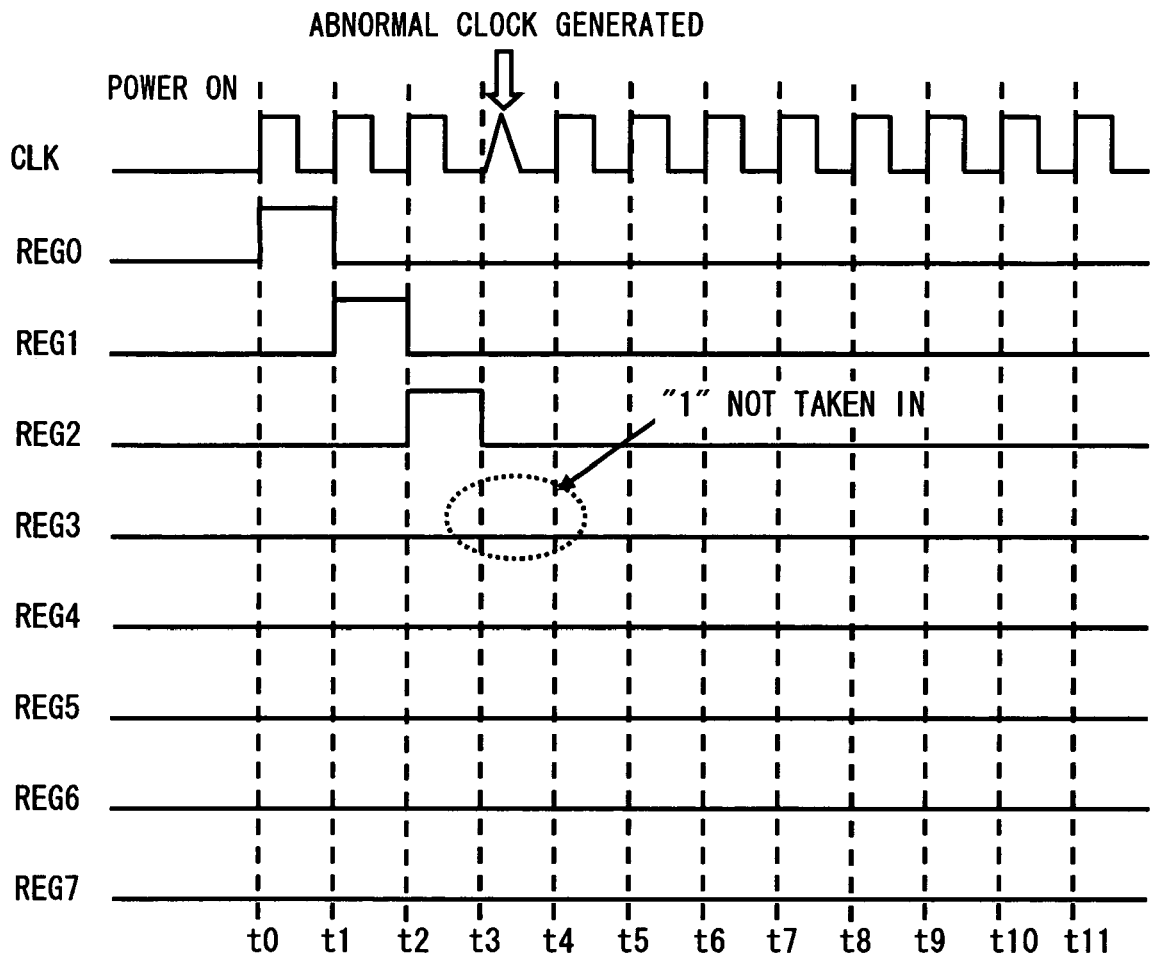
FIG. 8 is a timing chart in case data 1 is lost in a shift register of a conventional technique.

A shift register 1' inputting outputs from N registers (in this embodiment, REG0 to REG7) into the reset circuit is explained hereinafter in detail. FIG. 4 shows a circuit diagram of the shift register 1'. FIG. 5 shows a timing chart of the shift register 1' of FIG. 4. As shown in FIG. 5, in the shift register 1', in case all the outputs from the registers REG0 to REG7 become data 0, a reset circuit 10' outputs a reset signal (for example data 1). Accordingly, after data 1 is taken into the register REG7, the last stage, and then data 0 is taken in again, all the outputs from the registers REG0 to REG7 become data 0. The reset circuit 10' generates a reset signal (for example data 1) in response to this. In such case, the synchronizing clock that makes the register REG7 to transit from data 1 to data 0 is not used for an operation for the shift register 1' to transit data 1. That is, a period from timings t8 to t9 is a dead cycle when data 1 does not transit between registers.

On the other hand the shift register 1 of the first embodiement (as shown in FIGS. 1 and 2) inputs outputs from the N−1 registers (in this embodiment the registers REG0 to REG6), which is excluding the last stage, into the reset circuit 10. By such connection, when data 1 transits from the register REG6, which is N−1 stage, to the register REG7, which is Nth stage, all the outputs from the registers REG0 to REG6 that are input to the reset circuit 10 become data 0. This makes the reset circuit 10 to generate the reset signal (for example data 1). Further, data 1 is stored to the first stage register REG0 at a rising edge of a synchronizing clock when data stored to the register REG7 transits from data 1 to data 0. Accordingly while the registers REG0 to REG6 output a signal of a first logical level (For example data 0) and the last stage register REG7 outputs a signal of a second logical level (for example data 1), the reset circuit 10 of this embodiment outputs data 1 and the first stage register REG0 inputs data 1. Thus it is possible to eliminate a period that the shift register 1 stores data 1. The shift register 1 of this embodiment is able to use all the rising edges of the synchronizing clocks for transition of data 1.

The present invention is not limited to the above embodiment but may be modified as appropriate. For example the reset circuit 10 is not limited to the circuit configuration of the above embodiment but may be changed as long as it has a logic of generating data 1 in case all signals being input become data 0.

It is apparent that the present invention is not limited to the above embodiment and it may be modified and changed without departing from the scope and spirit of the invention.

What is claimed is:

1. A semiconductor integrated circuit apparatus comprising:
 a periodic signal generation circuit connected with N logical circuits, wherein the N is a natural number, outputting a periodic signal; and
 a reset circuit outputting a reset signal initializing according to outputs from a first stage logic circuit to N−1th logic circuit among the N logic circuits,
 wherein the reset circuit comprises:
 a plurality of NOR gate input with at least two of the output signals among the output signals from the first stage logic circuit to the N−1th logic circuit; and
 an AND gate input with outputs from the plurality of NOR gate.

2. A semiconductor integrated circuit, comprising:
 a shift register having a plurality of registers including a first stage register coupled to an input of the shift register, a final stage register coupled to an output of the shift register, and other registers coupled between the first stage register and the final stage register, each of the registers being respectively responsive to a clock signal to transfer an input signal at the input of the shift register towards the output of the shift register; and
 a reset circuit coupled to receive output signals from each of the registers except for the final stage register to set another input signal for the shift register in response selectively to the first stage register and the other registers among the registers in the shift register.

3. The semiconductor integrated circuit according to claim 2, wherein the another input signal has a same signal level with the input signal.

4. The semiconductor integrated circuit according to claim 2 further comprising an internal circuit block different from the reset circuit and different from the shift register, the output of the shift register being coupled to the internal circuit block, wherein a clock input of the first stage register is coupled with a clock input of the final stage register whereas an input of the first stage register is separate from an output of the final stage register.

5. The semiconductor integrated circuit according to claim 2, wherein the reset circuit includes a NOR gate coupled to an output port of one of the plurality of registers included in the shift register, and an AND gate coupled to an output port of the NOR gate.

6. The semiconductor integrated circuit according to claim 5, wherein
 the reset circuit further includes another NOR gate coupled to an output port of another one of said plurality of registers included in the shift register, and
 the AND gate is coupled to an output port of the another NOR gate.

7. A semiconductor integrated circuit, comprising:
a shift register including a first stage register, final stage register, and other registers connected between the first stage register and the final stage register, and capable of shifting an input data from the first stage register to the final stage register via the other registers, each of the first register and the final register, and each of the other registers receiving a synchronized clock signal; and
a reset circuit outputting a reset signal to set another input data to the shift register in response to an output signal from the shift register,
wherein the final stage register does not set a data to the first stage register in the shift register.

8. A semiconductor integrated circuit, comprising:
a function block to which an input data is set and capable of performing a predetermined operation to the input data in response to a clock signal; and
a reset circuit outputting a reset signal to set another input data to the function block in response to a phenomenon generated in the function block caused by an abnormal reduction of an amplitude of the clock signal.

9. The semiconductor integrated circuit according to claim 8, wherein the function block is a shift register including a first stage register, final stage register, and other registers connected between the first stage register and the final stage register, and capable of shifting an input data from the first stage register to the final stage register via the other registers, each of the first register and the final register, and each of the other registers receiving a clock signal.

* * * * *